(12) United States Patent
Lee et al.

(10) Patent No.: US 8,030,755 B2
(45) Date of Patent: Oct. 4, 2011

(54) INTEGRATED CIRCUIT PACKAGE SYSTEM WITH A HEAT SINK

(75) Inventors: Sangkwon Lee, Kyunggi-Do (KR); Tae Keun Lee, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 294 days.

(21) Appl. No.: 11/307,532

(22) Filed: Feb. 10, 2006

(65) Prior Publication Data

US 2007/0108587 A1 May 17, 2007

Related U.S. Application Data

(60) Provisional application No. 60/594,609, filed on Apr. 22, 2005.

(51) Int. Cl.
*H01L 23/10* (2006.01)

(52) U.S. Cl. ........ 257/706; 257/718; 257/719; 257/720; 257/796; 257/E33.075; 257/E23.051; 257/E23.094; 257/E23.103; 438/122

(58) Field of Classification Search .............. 257/706, 257/710, 276, 625, 675, 707, 712–722, 796, 257/E33.075, E31.131, E23.051, E23.08–E23.113; 438/122, 125, FOR. 413

See application file for complete search history.

(56) References Cited

U.S. PATENT DOCUMENTS

| | | | | |
|---|---|---|---|---|
| 4,993,482 | A | * | 2/1991 | Dolbear et al. ............... 165/80.2 |
| 5,615,087 | A | * | 3/1997 | Wieloch ......................... 361/719 |
| 6,462,952 | B1 | * | 10/2002 | Ubukata et al. ............... 361/719 |
| 6,525,942 | B2 | | 2/2003 | Huang et al. .................. 361/704 |
| 6,706,563 | B2 | * | 3/2004 | Shim et al. .................... 438/125 |
| 6,714,414 | B1 | | 3/2004 | Dubovsky et al. ............ 361/704 |
| 6,819,566 | B1 | | 11/2004 | Danovitch et al. ............ 361/704 |
| 7,177,156 | B2 | * | 2/2007 | Yatskov et al. ............... 361/709 |
| 2002/0015288 | A1 | * | 2/2002 | Dibene et al. ................. 361/711 |
| 2004/0075168 | A1 | * | 4/2004 | Azuma .......................... 257/718 |
| 2004/0164402 | A1 | * | 8/2004 | Yoshimura .................... 257/706 |
| 2005/0269675 | A1 | | 12/2005 | Prindiville .................... 257/666 |

* cited by examiner

*Primary Examiner* — Jasmine Clark
(74) *Attorney, Agent, or Firm* — Mikio Ishimaru

(57) ABSTRACT

An integrated circuit package system is provided forming a substrate having an integrated circuit die thereon, thermally connecting a heat slug and a resilient thermal structure to the integrated circuit die, and encapsulating the resilient thermal structure.

20 Claims, 3 Drawing Sheets

INTEGRATED CIRCUIT PACKAGE SYSTEM WITH A HEAT SINK

CROSS-REFERENCES TO RELATED APPLICATIONS

This application claims the benefit of U.S. Provisional Patent Application Ser. No. 60/594,609 filed Apr. 22, 2005, and the subject matter thereof is hereby incorporated herein by reference thereto.

TECHNICAL FIELD

The present invention relates generally to integrated circuit packages and more particularly to heat dissipating integrated circuit package system.

BACKGROUND ART

Consumer electronics requirements demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. As more functions are packed into the integrated circuits and more integrated circuits into the package, more heat is generated degrading the performance and potentially the reliability of the integrated circuits. While these approaches provide more functions within an integrated circuit, they do not fully address the requirements for lower height, smaller space, heat dissipation, and cost reduction.

Modern consumer electronics, such as smart phones, personal digital assistants, and location based services devices, are packing more integrated circuits into an ever shrinking physical space with expectations for decreasing cost. Contemporary consumer electronics expose integrated circuits and packages to more demanding and sometimes new environmental conditions, such as cold, heat, and humidity requiring integrated circuit packages to provide robust thermal management structures. Numerous technologies have been developed to meet these requirements. Some of the research and development strategies focus on new package technologies while others focus on improving the existing and mature package technologies. Research and development in the existing package technologies may take a myriad of different directions.

Every new generation of integrated circuits with increased operating frequency, performance and the higher level of large scale integration have underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

One proven way to reduce cost is to use mature package technologies with existing manufacturing methods and equipments. Paradoxically, the reuse of existing manufacturing processes does not typically result in the reduction of package dimensions. Existing packaging technologies struggle to cost effectively meet the ever demanding thermal requirements of today's integrated circuits and packages. Most integrated circuit devices use molded plastic epoxy as an epoxy molding compound (EMC) for protecting package. But the poor heat dissipation property of EMC sometimes leads to device malfunctions.

To provide a thermal solution, many kinds of technology have been developed. The most representative technology is a heat slug mounting. But a heat slug by itself provides limited improvements in thermal performance. Current thermally enhanced ball grid array (TEBGA) packages use heat slugs to improve thermal performance, but these packages only provide a 15% improvement in thermal performance over a conventional plastic ball grid array (PBGA) package. However, even a TEBGA package is subject to performance problems because it uses EMC, which is low thermal conductivity material.

Thus, a need still remains for an integrated circuit package system providing low cost manufacturing, improved thermal performance, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a substrate having an integrated circuit die thereon, thermally connecting a heat slug and a resilient thermal structure to the integrated circuit die, and encapsulating the resilient thermal structure.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Figure 1:
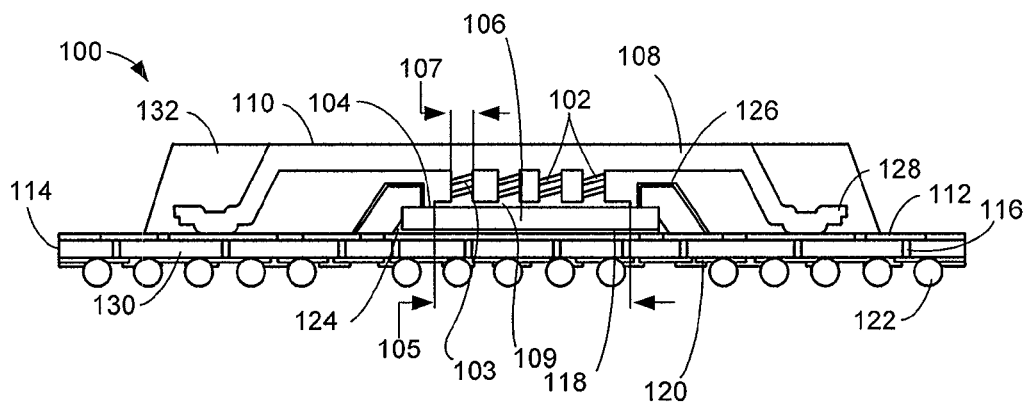
FIG. 1 is a cross-sectional view of an integrated circuit package system in an embodiment of the present invention.

Referring now to FIG. 1, therein is shown a cross-sectional view of an integrated circuit package system 100 in an embodiment of the present invention. The integrated circuit package system 100 provides a high thermal performance management system with thermal flow paths to a top and a bottom of the integrated circuit package system 100.

Resilient thermal structures 102, such as a coil type spacer with multiple coils 103, provide thermal paths from an active side 104 of an integrated circuit die 106 to a heat slug 108, such as a cap-type heat slug of a thermally conductive material, dissipating heat from a slug surface 110 at the top of the integrated circuit package system 100. The resilient thermal structures 102 also serve as spacers between the heat slug 108 and the integrated circuit die 106. The resilient thermal structures 102 may be attached to the integrated circuit die 106 by a number of processes, such as a coil spacer attach process. The resilient thermal structure 102 has a base 109 in direct contact and uninterrupted contact with the integrated circuit die 106 with a lateral distance 105 that is larger than a width 107 of the coil 103.

A top metal layer 112 of a substrate 114 and electrical vias 116 under the integrated circuit die 106 provide thermal paths from a non-active side 118 of the integrated circuit die 106 to a bottom metal layer 120 connected to external interconnects 122, such as solder balls. The paths from the non-active side 118 to the external interconnects 122 form the thermal paths to the bottom of the integrated circuit package system 100 spreading the heat to the next system level (not shown), such as a printed circuit board.

The integrated circuit die 106 is mounted to the substrate 114 with an adhesive 124, such as an epoxy or a thermally conductive adhesive. Electrical interconnects 126, such as bond wires, form connections between the active side 104 and predetermined portions of the top metal layer 112. The heat slug 108 also connects to predetermined portions of the top metal layer 112, away from the integrated circuit die 106, forming thermal paths to the bottom of the integrated circuit package system 100. The resilient thermal structures 102 are also substantially elastic and compressible supporting, with slug ends 128, the heat slug 108 ensuring contact to the heat slug 108 and the integrated circuit die 106. The resiliency of the resilient thermal structures 102 exerts a counter force to the compression force that does not damage the integrated circuit die 106 or cause separation of the heat slug 108 from the substrate 114. The substrate 114 also includes an insulator 130 isolating the traces of the top metal layer 112 from each other, the traces of the bottom metal layer 120 from each other, the top metal layer 112 from the bottom metal layer 120, and the electrical vias 116 from each other.

A molding compound 132, such as an epoxy molding compound, in and around the resilient thermal structures 102 encapsulates the resilient thermal structures 102, the integrated circuit die 106, the heat slug 108, the electrical interconnects, and a top of the substrate 114. The resilient thermal structures 102 buffer the stress to the integrated circuit die 106 from the molding process. The slug surface 110 of the heat slug 108 may be exposed by a number of processes, such as a chemical mechanical planarization (CMP), allowing heat dissipation to ambient air or may be connected to an external heat sink structure (not shown), such as a fan or cooling fins. The resilient thermal structures 102, the heat slug 108, paths from the top metal layer 112 to the external interconnects 122, and paths from the slug ends 128 to the external interconnects 122 are more thermally conductive than the molding compound 132. The resilient thermal structures 102 serve as thermal vias in the molding compound 132.

For illustrative purpose, the resilient thermal structures 102 are shown between the integrated circuit die 106 and the heat slug 108, although it is understood that the resilient thermal structures 102 may be integral or separate to the heat slug 108 as well as placed at different locations. Also for illustrative purpose, the substrate 114 is shown having two layers, although it is understood that the number of layers may differ. Further for illustrative purpose, the integrated circuit die 106 is shown as a wire bond integrated circuit, although it is understood that the integrated circuit die may have alternative interconnects, such as flip chip.

Figure 2:
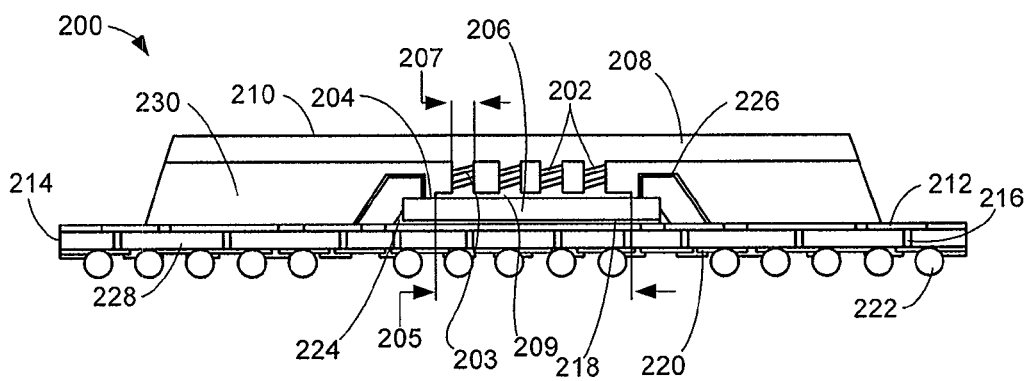
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. The integrated circuit package system 200 provides a high thermal performance management system with thermal flow paths to a top and a bottom of the integrated circuit package system 200.

Resilient thermal structures 202, such as a coil type spacer with multiple coils 203, provide thermal paths from an active side 204 of an integrated circuit die 206 to a heat slug 208, such as a flat or planar type heat slug of a thermally conductive material, dissipating heat from a slug surface 210 at the top of the integrated circuit package system 200. The resilient thermal structures 202 also serve as spacers between the heat slug 208 and the integrated circuit die 206. The resilient thermal structures 202 may be attached to the integrated circuit die 206 by a number of processes, such as a coil spacer attach process. The resilient thermal structure 202 has a base 209 in direct contact and uninterrupted contact with the integrated circuit die 206 with a lateral distance 205 that is larger than a width 207 of the coil 203.

A top metal layer 212 of a substrate 214 and electrical vias 216 under the integrated circuit die 206 provide thermal paths from a non-active side 218 of the integrated circuit die 206 to a bottom metal layer 220 connected to external interconnects 222, such as solder balls. The paths from the non-active side 218 to the external interconnects 222 form the thermal paths to the bottom of the integrated circuit package system 200 spreading the heat to the next system level (not shown), such as a printed circuit board.

The integrated circuit die 206 is mounted to the substrate 214 with an adhesive 224, such as an epoxy or a thermally conductive adhesive. Electrical interconnects 226, such as bond wires, form connections between the active side 204 and predetermined portions of the top metal layer 212. The heat slug 208 also connects to predetermined portions of the top metal layer 212, away from the integrated circuit die 206, forming thermal paths to the bottom of the integrated circuit package system 200. The resilient thermal structures 202 are also substantially elastic and compressible supporting the heat slug 208 ensuring contact to the heat slug 208 and the integrated circuit die 206. The resiliency of the resilient thermal structures 202 exerts a counter force to the compression force that does not damage the integrated circuit die 206 or cause separation of the heat slug 208 from the substrate 214. The substrate 214 also includes an insulator 228 isolating the traces of the top metal layer 212 from each other, the traces of the bottom metal layer 220 from each other, the top metal layer 212 from the bottom metal layer 220, and the electrical vias 216 from each other.

A molding compound 230, such as an epoxy molding compound, encapsulates the resilient thermal structures 202, the integrated circuit die 206, the heat slug 208, the electrical interconnects, and a top of the substrate 214. The resilient thermal structures 202 buffer the stress to the integrated circuit die 206 from the molding process. The slug surface 210 of the heat slug 208 may be exposed by a number of processes, such as a chemical mechanical planarization (CMP), or may be left exposed from the molding process allowing heat dissipation to ambient air or may be connected to an external heat sink structure (not shown), such as a fan or cooling fins. The resilient thermal structures 202, the heat slug 208, and paths from the top metal layer 212 to the external interconnects 222 are more thermally conductive than the molding compound 230. The resilient thermal structures 202 serve as thermal vias in the molding compound 230.

For illustrative purpose, the resilient thermal structures 202 are shown between the integrated circuit die 206 and the heat slug 208, although it is understood that the resilient thermal structures 202 may be integral or separate to the heat slug 208 as well as placed at different locations. Also for illustrative purpose, the substrate 214 is shown having two layers, although it is understood that the number of layers may differ. Further for illustrative purpose, the integrated circuit die 206 is shown as a wire bond integrated circuit, although it is understood that the integrated circuit die may have alternative interconnects, such as flip chip.

Figure 3:
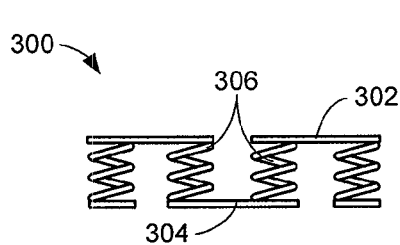
FIG. 3 is a cross-sectional view of an interconnected resilient thermal structure for an integrated circuit package system in an embodiment of the present invention.

Referring now to FIG. 3, therein is shown a cross-sectional view of an interconnected resilient thermal structure 300 for an integrated circuit package system in an embodiment of the present invention. The interconnected resilient thermal structure 300 has a coil 306 connected to another with a top interconnect 302 or a bottom interconnect 304.

The top interconnect 302 and the bottom interconnect 304 provide mechanical support holding the coil 306 in relative position from one another while undergoing encapsulation. The interconnected resilient thermal structure 300 spreads the heat throughout the heat slug 108 of FIG. 1 from the integrated circuit die 106 of FIG. 1, especially as the integrated circuit die 106 form different heat regions.

For illustrative purpose, the interconnected resilient thermal structure 300 is described as between the integrated circuit die 106 and the heat slug 108, although it is understood that the interconnected resilient thermal structure 300 may be integral or separate to the heat slug 108 as well as placed at different locations. Also for illustrative purpose, the coil 306 is shown having the top interconnect 302 or the bottom interconnect 304 except on the coil 306 transitioning between the top interconnect 302 and the bottom interconnect 304, although it is understood that all the coil 306 may have only the top interconnect 302, only the bottom interconnect 304, both, or none.

Figure 4:
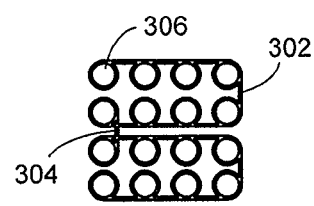
FIG. 4 is a top view of the interconnected resilient thermal structure for an integrated circuit package system.

Referring now to FIG. 4, therein is shown a top view of the interconnected resilient thermal structure 300 for an integrated circuit package system. The top view depicts the coil 306 in an array configuration with the bottom interconnect 304 connecting the sub-array of the coil 306. The top interconnect 302 connects the coil 306 in the sub-array. The coil 306 spread the contact force on the integrated circuit die 106 of FIG. 1 minimizing risk of damage to the integrated circuit die 106. The diameter of the coil 306 provides space for the molding compound 132 of FIG. 1 to secure the interconnected resilient thermal structure 300 in the molding compound 132 and adequate surface contact to the integrated circuit die 106 and the heat slug 108 of FIG. 1 for heat transfer.

Figure 5:
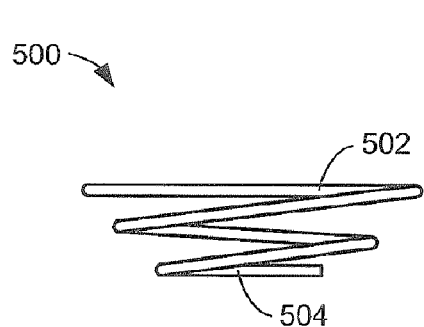
FIG. 5 is a cross-sectional view of a single resilient thermal structure for an integrated circuit package system in an embodiment of the present invention.

Referring now to FIG. 5, therein is shown a cross-sectional view of a single resilient thermal structure 500 for an integrated circuit package system in an embodiment of the present invention. The single resilient thermal structure 500 is a single coil-type spacer with the coil at a top 502 wider than the coil at a bottom 504. The narrowness of the bottom 504 allows the single resilient thermal structure 500 attach to a smaller surface area on the integrated circuit die 106 of FIG. 1. The wideness of the top 502 allows a larger surface area for maximum heat transfer to the top 502 and the heat slug 108 of FIG. 1. For illustrative purpose, the single resilient thermal structure 500 is described as between the integrated circuit die 106 and the heat slug 108, although it is understood that the single resilient thermal structure 500 may be integral or separate to the heat slug 108 as well as placed at different locations.

Figure 6:
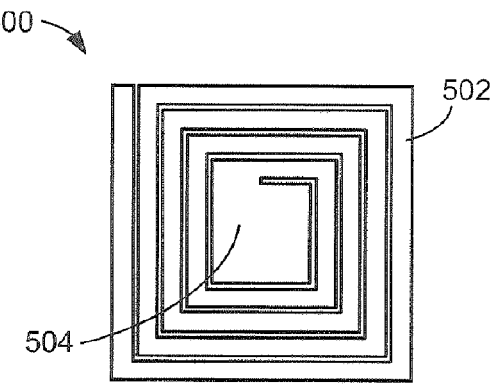
FIG. 6 is a top view of the single resilient thermal structure for an integrated circuit package system.

Referring now to FIG. 6, therein is shown a top view of the single resilient thermal structure 500 for an integrated circuit package system. The top view depicts the single resilient thermal structure 500 as a single coil-type spacer in a geometric shape, such as a rectangular shape. The bottom 504 is a single plate spreading the contact force on the integrated circuit die 106 as well as maximizing surface area for maximum heat transfer to the heat slug 108 of FIG. 1.

Figure 7:
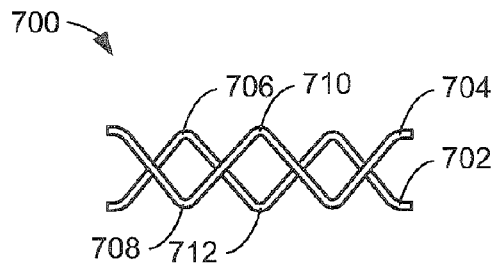
FIG. 7 is a cross-sectional view of a complementary resilient thermal structure for an integrated circuit package system in an embodiment of the present invention.

Referring now to FIG. 7, therein is shown a cross-sectional view of a complementary resilient thermal structure 700 for an integrated circuit package system in an embodiment of the present invention. The complementary resilient thermal structure 700 may be used to transfer heat from the integrated circuit die 106 of FIG. 1 to the heat slug 108 of FIG. 1.

The complementary resilient thermal structure 700 includes a first spacer 702, such as a spacer with sinusoid configuration, and a second spacer 704, such as a spacer with a sinusoid configuration. The first spacer 702 forms a wave structure with a zero-phase peak 706 and a zero-phase valley 708. The second spacer 704 also forms a wave structure with a pi-phase peak 710 and a pi-phase valley 712 at locations that are 180° phase shifted from the zero-phase peak 706 and the zero-phase valley 708, respectively. For illustrative purpose, the complementary resilient thermal structure 700 is described as between the integrated circuit die 106 and the heat slug 108, although it is understood that the complementary resilient thermal structure 700 may be integral or separate to the heat slug 108 as well as placed at different locations.

Figure 8:
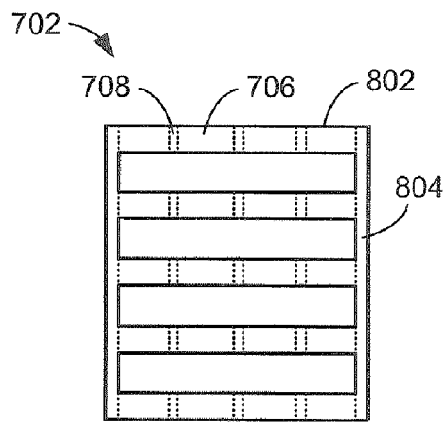
FIG. 8 is a top view of the first spacer of the complementary thermal structure of FIG. 7.

Referring now to FIG. 8, therein is shown a top view of the first spacer 702 of the complementary resilient thermal structure 700 of FIG. 7. The first spacer 702 has a number of a spacer structure 802 in a parallel configuration and connected by a support 804 on both ends of the first spacer 702. Each of the spacer structure 802 has the zero-phase peak 706 and the zero-phase valley 708 at substantially the same locations as another of the spacer structure 802.

Figure 9:
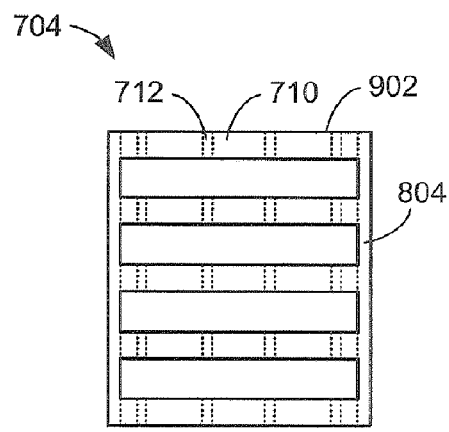
FIG. 9 is a top view of the second spacer of the complementary thermal structure of FIG. 7.

Referring now to FIG. 9, therein is shown a top view of the second spacer 704 of the complementary resilient thermal structure 700 of FIG. 7. The second spacer 704 has a complementary spacer structure 902 in a parallel configuration and connected by the support 804 on both ends of the second spacer 704. Each of the complementary spacer structure 902 has the pi-phase peak 710 and the pi-phase valley 712 at substantially the same locations as another of the complementary spacer structure 902. The complementary resilient thermal structure 700 has the first spacer 702 intertwined with the second spacer 704 such that the spacer structure 802 and the complementary spacer structure 902 alternate.

Figure 10:
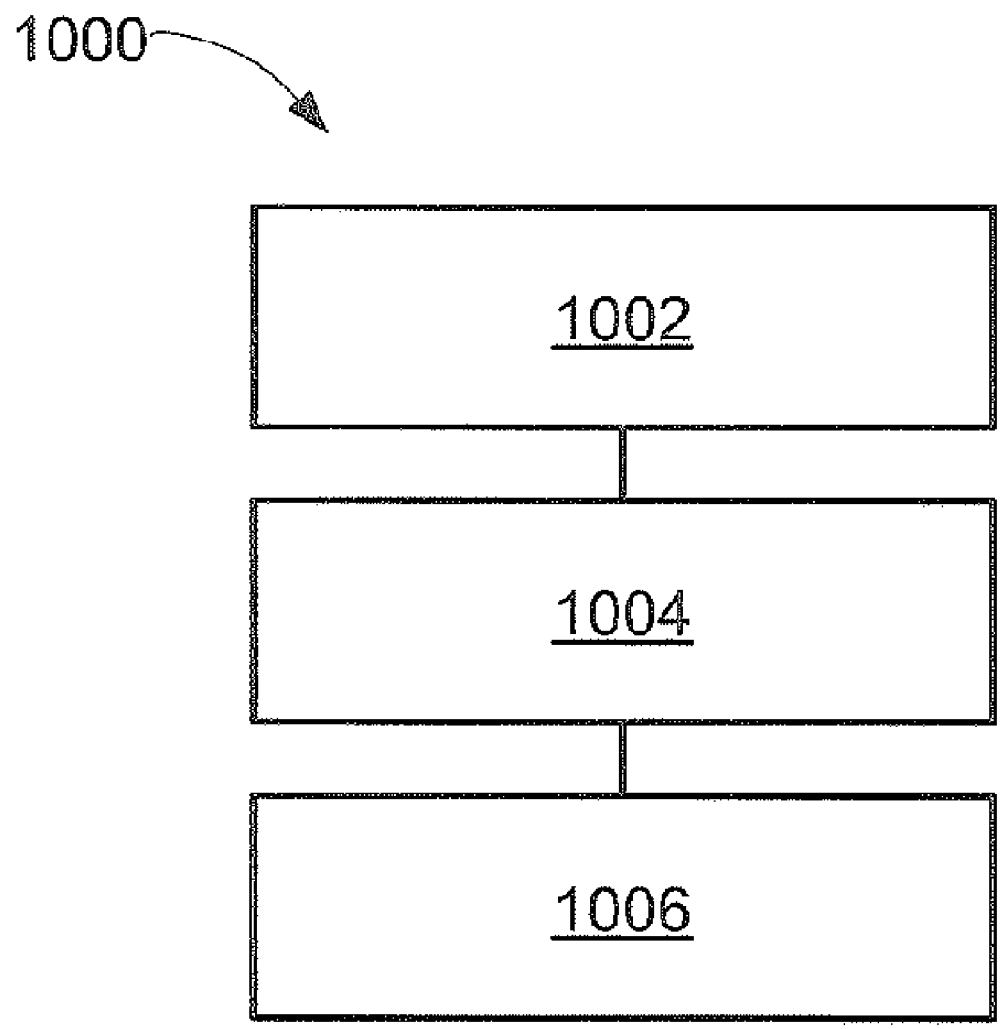
FIG. 10 is a flow chart of an integrated circuit package system for manufacture of the integrated circuit package system in an embodiment of the present invention.

Referring now to FIG. 10, therein is shown a flow chart of an integrated circuit package system 1000 for manufacture of the integrated circuit package system 100 in an embodiment of the present invention. The system 1000 includes forming a substrate having an integrated circuit die thereon in a block 1002; thermally connecting a heat slug and a resilient thermal structure to the integrated circuit die in a block 1004; and encapsulating the resilient thermal structure in a block 1006.

It has been discovered that the present invention thus has numerous aspects.

It has been discovered that heat transfer from an integrated circuit die to a heat slug can be significantly improved over a thermally enhanced ball grid array (TEBGA) by inserting a resilient conductive contact, such as a coil spacer between the integrated circuit die and the heat slug.

It has also been discovered that several coil type spacer designs will increase heat dissipation as an interconnection mechanism of a die with different types of heat slugs.

It has further been discovered that different embodiments of the coil type spacers of the present invention also act as buffers to absorb stresses during the mold process, as well as acting as thermal vias after molding.

An aspect is that the present invention provides the thermal structures, such as a coil-type spacer of various configurations, enhance heat transfer from the integrated circuit die to the heat slug beyond the heat transfer through the epoxy molding compound. This increases the overall thermal performance of the integrated circuit package system from convention thermal solutions where majority of the heat transfer is through the bottom of the integrated circuit package system.

Another aspect of the present invention is that the thermal structures provide a more reliable and higher yielding thermal conduction contact to the integrated circuit die compared to the heat slug physically contacting the active side of the integrated circuit die.

Yet another aspect of the present invention is that the thermal structures may be formed of various configurations to work with different sizes, thickness, and electrical interconnect structures.

Yet another important aspect of the present invention is that it valuably supports and services the historical trend of reducing costs and increasing performance. These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method for manufacture of an integrated circuit package system comprising:

forming a substrate having an integrated circuit die thereon;

thermally connecting a heat slug and the integrated circuit die by a resilient thermal structure having multiple coils and a base positioned between the heat slug and the integrated circuit die, and the base is in direct uninterrupted contact with the integrated circuit die with a lateral distance larger than a width of each of the multiple coils; and encapsulating the integrated circuit die and the resilient thermal structure with a molding compound in and around the resilient thermal structure.

2. The method as claimed in claim 1 wherein thermally connecting the heat slug and the resilient thermal structure to the integrated circuit die comprises forming an interconnected resilient thermal structure with a coil in an array configuration connected with a top interconnect and a bottom interconnect.

3. The method as claimed in claim 1 wherein thermally connecting the heat slug and the resilient thermal structure to the integrated circuit die comprises forming a single resilient thermal structure with a coil having a plate at a bottom of the coil on the integrated circuit die.

4. The method as claimed in claim 1 wherein thermally connecting the heat slug and the resilient thermal structure to the integrated circuit die comprises forming a complementary resilient thermal structure having an alternating configuration with a spacer structure and a complementary spacer.

5. The method as claimed in claim 1 wherein thermally connecting the heat slug and the resilient thermal structure to the integrated circuit die comprises positioning a cap-type heat slug over the integrated circuit die.

6. A method for manufacture of an integrated circuit package system comprising:

forming a substrate having an integrated circuit die on the substrate with an adhesive;

forming a top thermal path with a slug surface of a heat slug and a resilient thermal structure having multiple coils and a base positioned between the heat slug and the integrated circuit die, and the base is in direct uninterrupted contact with the integrated circuit die with a lateral distance larger than a width of each of the multiple coils;

forming a bottom thermal path with a metal layer of the substrate and an external interconnect below the integrated circuit die; and encapsulating the integrated circuit and the resilient thermal structure with a molding compound in and around the resilient thermal structure.

7. The method as claimed in claim 6 further comprising connecting an electrical interconnect between the integrated circuit die and the substrate.

8. The method as claimed in claim 6 wherein forming the top thermal path with the slug surface of the heat slug and the resilient thermal structure comprises forming the top thermal path with a flat heat slug and the resilient thermal structure.

9. The method as claimed in claim 6 wherein forming the substrate comprises forming the substrate having two layers.

10. The method as claimed in claim 6 further comprising attaching a slug end of the heat slug to the metal layer of the substrate.

11. An integrated circuit package system comprising:
a substrate having an integrated circuit die thereon;
a heat slug thermally connected to the integrated circuit die by a resilient thermal structure having multiple coils and a base positioned between the heat slug and the integrated circuit die, and the base is in direct uninterrupted contact with the integrated circuit die with a lateral distance larger than a width of each of the multiple coils; and
a molding compound encapsulating the integrated circuit die and in and around the resilient thermal structure.

12. The system as claimed in claim 11 wherein the heat slug and the resilient thermal structure thermally connected to the integrated circuit die comprises an interconnected resilient thermal structure with a coil in an array configuration connected with a top interconnect and a bottom interconnect.

13. The system as claimed in claim 11 wherein the heat slug and the resilient thermal structure thermally connected to the integrated circuit die comprises a single resilient thermal structure having a plate on the integrated circuit die.

14. The system as claimed in claim 11 wherein the heat slug and the resilient thermal structure thermally connected to the integrated circuit die comprises a complementary resilient thermal structure having an alternating configuration with a spacer structure and a complementary spacer structure.

15. The system as claimed in claim 11 wherein the heat slug and the resilient thermal structure thermally connected to the integrated circuit die is a cap-type heat slug over the integrated circuit die.

16. The system as claimed in claim 11 wherein:
the substrate having an integrated circuit die thereon has an insulator;
the heat slug and the resilient thermal structure are thermally connected to the integrated circuit die;
the molding compound to cover the resilient thermal structure is an epoxy molding compound; and
further comprising:
a top thermal path with a slug surface of the heat slug and the resilient thermal structure to the integrated circuit die; and
a bottom thermal path with a metal layer of the substrate and an external interconnect below the integrated circuit die.

17. The system as claimed in claim 16 further comprising an electrical interconnect between the integrated circuit die and the substrate.

18. The system as claimed in claim 16 wherein the top thermal path with the slug surface of the heat slug and the resilient thermal structure comprises the top thermal path with a flat heat slug and the resilient thermal structure.

19. The system as claimed in claim 16 wherein the substrate is the substrate having two layers.

20. The system as claimed in claim 16 further comprising a slug end of the heat slug attached to the metal layer of the substrate.

* * * * *